United States Patent [19]

Suzuki et al.

[11] Patent Number: 4,960,073
[45] Date of Patent: Oct. 2, 1990

[54] MICROWAVE PLASMA TREATMENT APPARATUS

[75] Inventors: Yasuhiro Suzuki; Sumio Mori; Eiji Fujiyama; Masami Sasaki, all of Fuchu, Japan

[73] Assignee: Anelva Corporation, Tokyo, Japan

[21] Appl. No.: 407,187

[22] Filed: Sep. 14, 1989

[30] Foreign Application Priority Data

Sep. 19, 1988 [JP] Japan ................... 63-234037

[51] Int. Cl.$^5$ ............................................. C23C 16/50
[52] U.S. Cl. ..................................... 118/723; 156/345
[58] Field of Search ........................ 118/723; 156/345

[56] References Cited

U.S. PATENT DOCUMENTS 4,401,054  8/1983  Matsuo ................... 118/723

FOREIGN PATENT DOCUMENTS 3144016  7/1982  Fed. Rep. of Germany ...... 118/723
62-80950  4/1987  Japan.

Primary Examiner—Richard Bueker
Attorney, Agent, or Firm—Pollock, VandeSande & Priddy

[57] ABSTRACT

A microwave plasma treatment apparatus comprises a plurality of auxiliary magnets arranged around the periphery of a plasma formation chamber. A plurality of auxiliary magnets are disposed along the circumference of the plasma formation chamber while a plurality of auxiliary magnets may also be arranged in the axial direction of the plasma formation chamber. Also, the magnetic poles of every auxiliary magnet are respectively reverse in polarity to the adjoining magnetic poles of an auxiliary magnet(s) disposed adjacent thereto either along the circumference of the plasma formation chamber or in the axial direction thereof. This enables the whole high-density plasma to be substantially uniform throughout the inside of the plasma formation chamber.

7 Claims, 6 Drawing Sheets

MICROWAVE PLASMA TREATMENT APPARATUS

BACKGROUND OF THE INVENTION

Field of the Invention

The present invention relates to a microwave plasma treatment apparatus, and more particularly to a microwave plasma treatment apparatus wherein the electron cyclotron resonance (ECR) phenomenon is utilized to form a plasma which is used to carry out a surface treatment of a substrate or the like, examples of which treatment include etching thereof and thin film deposition or formation thereon.

As a conventional microwave plasma treatment apparatus of the type as described above, there is known, for example, an apparatus disclosed in Japanese Patent Laid-Open No. 155,535/1981.

Prior to the description of the present invention, a brief description will first be made of a microwave plasma treatment technique disclosed in the above-mentioned patent literature.

FIG. 1 is a schematic partial front cross-sectional view of the above-mentioned conventional apparatus, wherein the essential constituent parts thereof are illustrated.

In FIG. 1, numeral 10 refers to a cylindrical plasma formation chamber, while numeral 12 refers to an object treatment chamber provided adjacent to the plasma formation chamber 10 in the direction of the central axis O thereof. The plasma formation chamber 10 is usually provided, at the end portion thereof opposite to the object treatment chamber 12 in the direction of the above-mentioned central axis O, with a microwave introducing window 14 made of an insulating material such as quartz glass or a ceramic material, through which microwaves of, for example, 2.45 GHz in frequency sent through a wave guide pipe 18 from an external microwave power source 16 pass to be introduced into the plasma formation chamber 10. Additionally stated, the illustration of matching device, a microwave power meter, an isolator, etc. as usually provided between the wave guide pipe 18 and the microwave introducing window 14 is omitted in FIG. 1.

A plasma extracting means 20 is provided on the border between the plasma formation chamber 10 and the object treatment chamber 12. The plasma extracting means 20 is usually constituted of a quartz ring, the central aperture of which serves as a plasma extracting aperture 22, through which a plasma is extracted from the plasma formation chamber 10 into the object treatment chamber 12. If necessary, the plasma extracting aperture 22 may be provided with a grid (grid electrode) (not shown in FIG. 1).

The object treatment chamber 12 is provided with an object table 24 on which an object 28 to be treated, such as a wafer, a glass substrate or other substrate, is to be placed. The object table 24 is of such a construction that a DC or AC voltage can be applied thereto from the outside. The object 28 (substrate) is carried into the object treatment chamber 12 from the outside by means of a substrate transportation mechanism not shown in FIG. 1, and is placed and held on the object table 24 in such a way that magnetic circuit(s) 26. The impinging effect of plasma ions against the object 28 (substrate) works to effect a surface treatment, such as etching or film formation, of the object 28 placed on the object table 24.

FIG. 2 is a diagram showing the curves of relationship between the plasma extraction distance (distance between the plasma extracting means or panel 20 and the substrate 28) and the ionic current density, which were obtained using the foregoing conventional apparatus. In FIG. 2, the abscissa represents the plasma extraction distance (unit: mm), while the left and right ordinates represent the uniformity of the ionic current density distribution ($\pm\%$) in the surface of a substrate and the in-surface average value of ionic current density (mA/cm$^2$), respectively. The substrate used is a wafer of 140 mm in diameter. As usual, Faraday cups were used at three points of the surface of the wafer to carry out the measurement. When $I_{MAX}$ and $I_{MIN}$ are the maximum and minimum ionic current densities, respectively, with $I_{AVE}$ being the average ionic current density, the uniformity of the ionic current density distribution in the surface of a substrate is calculated according to the formula:

$$\frac{I_{MAX} - I_{MIN}}{2 I_{AVE}} \times 100.$$

The measurement was carried out under such conditions that N$_2$ gas was introduced at a flow rate of 20 sccm into the plasma formation chamber 10 under an internal gas pressure of $5.0\times10^{-4}$ Torr, while at the same time introducing the surface thereof to be treated is confronted with the plasma extracting aperture 22.

A magnetic circuit(s) 26 constituted of, for example, a coreless solenoid coil(s) is provided around the outer periphery of the plasma formation chamber 10. A magnetic field is formed inside the plasma formation chamber 10 by means of the magnetic circuit(s) 26.

Further, this conventional apparatus is provided with a gas introducing system 30 for introducing a gas into the plasma formation chamber 10 in the case where the apparatus is used to carry out an etching treatment, or with gas introducing systems 30 and 32 for introducing respective gases into the plasma formation chamber 10 and the object treatment chamber 12, respectively, in the case where the apparatus is used to carry out a film deposition or formation treatment. The kind(s) of gas(es) to be introduced is chosen depending on the type of etching or the kind of film to be deposited or formed. A vacuum pumping system 34 is constituted of, for example, a turbo-molecular pump and a mechanical pump. In this conventional apparatus, microwaves are introduced into the plasma formation chamber 10 wherein a magnetic field with a predetermined intensity is formed by means of the magnetic circuit(s) 26, and induces therein electron cyclotron resonance (ECR), through which an energy is generated to form therewith a plasma from a plasma-forming gas introduced into the plasma formation chamber 10. The plasma formed in the plasma formation chamber 10 is extracted, in the form of a plasma stream, into the object treatment chamber 12 with the aid of the action of a divergent magnetic field formed with the thereinto microwaves generated at a microwave power of 600 W. The ionic current density distribution in the surface of the substrate and the in-surface average value of ionic current density, measured using the above-mentioned conventional apparatus under the foregoing conditions, are shown in FIG. 2 with plotting, wherein the Curve I refers to the uniformity of the in-surface ionic current density distribution while the Curve II refers to the in-surface average value of ionic current density. According to these experimental data, the larger the plasma extraction distance, the better the uniformity of the in-surface ionic current density distribution, but the lower the in-surface average value of ionic current density.

FIG. 3 shows the curves of relationship between the ionic current density in the surface of a substrate and the distance from the center of the substrate at respective applied microwave powers of 600 W and 800 W.

In FIG. 3, the abscissa represents the distance (mm) from the center of the substrate, while the ordinate represents the ionic current density (mA/cm$^2$). The experiment was carried out under substantially the same conditions as in the experiment relating to FIG. 2 except for the applied microwave power. In this experiment, the plasma extraction distance was set to be 60 mm. As will be understandable from the experimental data included in the Curve III (at 600 W) and the Curve IV (at 800 W), the value of ionic current density was highest at the center of the substrate with a tendency to lower toward the periphery of the substrate. Further, when the microwave power was larger, the difference in the value of ionic current density was larger between the center of the substrate and the periphery of the substrate than it was when the microwave power was smaller. The reason for this is believed to be that a plasma is concentrated in the vicinity of the central axis of the plasma formation chamber when the microwave power is increased, and that the concentrated plasma is guided from the inside of the plasma formation chamber into the object treatment chamber with the aid of the action of a divergent magnetic field formed with the solenoid coil(s) 26, with the result that the concentrated plasma reaches, as such, the substrate to provide the highest plasma density in the center of the substrate.

Since the uniformity of treatment speed distribution is determined by the distribution of plasma density and, in other words, ionic current density, such a large difference in the value of ionic current density between the center of a substrate and the periphery of the substrate as provided in the case of foregoing conventional apparatus results in a failure to provide a uniform treatment speed over the whole area of the surface of the substrate.

Thus, the use of the foregoing conventional apparatus of system cannot provide a uniform treatment of a substrate over the whole surface thereof. If the treatment of a substrate according to the above-mentioned conventional system is to be effected even a little more uniformly over the whole surface of the substrate, the plasma stream extraction distance must be set to be larger, with the disadvantageous result that the size of the apparatus is inevitably increased. Further, as the plasma extraction distance is increased, the ionic current density is lowered to disadvantageously reduce the treatment speed. Furthermore, enlargement of a microwave power source is necessary in order to increase the treatment speed.

An object of the present invention is to provide a small-sized microwave plasma treatment apparatus with which uniform etching as well as uniform film deposition or formation can be effected in various cases including the case where a large-diameter substrate is surface-treated and the case where the applied microwave power is increased.

In accordance with the present invention, there is provided a microwave plasma treatment apparatus comprising:

a cylindrical plasma formation chamber, an object treatment chamber adjoining the plasma formation chamber in the direction of the central axis thereof, a magnetic circuit(s) provided around the periphery of the plasma formation chamber, a plasma extracting means provided on the border between the plasma formation chamber and the object treatment chamber, an even-numbered plurality of auxiliary magnets numbering at least two and provided around the periphery of the plasma formation chamber and on the inner side of the magnetic circuit(s), and a microwave introducing means provided along the central axis of the plasma formation chamber and on the opposite side thereof to the object treatment chamber;

wherein the plasma formation chamber is provided with a plasma-forming gas introducing port, wherein the object treatment chamber is provided with an object table for placing thereon an object to be treated, wherein the auxiliary magnets are arranged symmetrically with respect to the central axis of the plasma formation chamber in such a way that the magnetic poles of every auxiliary magnet are respectively reverse in polarity to the adjoining magnetic poles of an auxiliary magnet(s) adjacent thereto, and wherein the electron cyclotron resonance phenomenon induced by an electric field formed by microwaves introduced into the plasma formation chamber through the microwave introducing means and a magnetic field formed by means of the magnetic circuit(s) and the auxiliary magnets is utilized to turn a plasma-forming gas introduced into the plasma formation chamber into a plasma, which is then extracted into the object treatment chamber through the plasma extracting means to irradiate therewith the object placed on the object table.

In the apparatus of the present invention, it is preferable that the above-mentioned auxiliary magnets be arranged in one or more groups in the direction of the central axis of the above-mentioned plasma formation chamber in such a way that the magnetic poles of each of auxiliary magnets in one group are reverse in polarity to the adjoining magnetic poles of an auxiliary magnet(s) in other group(s) adjacent thereto, if any.

In the apparatus of the present invention, it is preferable that the inner wall of the plasma formation chamber or at least a plasma introducing window which serves as part of the inner wall of the plasma formation chamber be made of an insulating material, and that microwaves are introduced into the plasma formation chamber through the above-mentioned inner wall or the plasma introducing window.

In the apparatus of the present invention, it is preferable that the above-mentioned microwave introducing means have an inner wall surface extending from the outside of the plasma formation chamber to the inside of the plasma formation chamber, disposed symmetrically with respect to the central axis of the plasma formation chamber and providing the inner diameter increasing along the above-mentioned central axis toward the above-mentioned extracting means.

In the apparatus of the present invention, it is preferable that the portion of the microwave introducing means located on the outside of the plasma formation chamber comprise a wave guide pipe, while the portion thereof located on the inside of the plasma formation chamber be constituted of a block made of a dielectric material.

In the apparatus of the present invention, it is preferable that the plasma formation chamber be shaped in the form of a cup opened on the side of the plasma extracting means, and that the microwave introducing means be shaped in the form of a horn opened on the side of the plasma extracting means and put on the plasma formation chamber to cover the same.

In the apparatus of the present invention, it is preferable that the auxiliary magnets be each constituted of a permanent magnet.

As described above, the microwave plasma treatment apparatus of the present invention is of such a construction that a plurality of the auxiliary magnets are arranged around the periphery of the plasma formation chamber not only in such a way that a plurality of auxiliary magnets are disposed along the circumference of the plasma formation chamber while a plurality of auxiliary magnets may also be arranged in the axial direction of the plasma formation chamber, but also in such a way that the magnetic poles of every auxiliary magnet are respectively reverse in polarity to the adjoining magnetic poles of an auxiliary magnet(s) disposed adjacent thereto either along the circumference of the plasma formation chamber or in the axial direction thereof.

The foregoing arrangement of the auxiliary magnets around the periphery of the plasma formation chamber enables a strong magnetic field to be formed in the neighborhood of the inner wall surface of the plasma formation chamber to thereby form a high-density plasma in the above-mentioned neighborhood. This enables the whole high-density plasma to be substantially uniform throughout the inside of the plasma formation chamber.

Where the apparatus of the present invention is of such a construction that the aforementioned microwave introducing means has an inner wall surface extending from the outside of the plasma formation chamber to the inside of the plasma formation chamber, disposed symmetrically with respect to the central axis of the plasma formation chamber and providing the inner diameter increasing along the above-mentioned central axis toward the aforementioned plasma extracting means, an electric field formed by microwave can be introduced into the plasma formation chamber without any loss thereof to thereby uniformize the plasma density, the uniformity of which can be further enhanced by virtue of the shape of the inner wall surface of the plasma formation chamber which is wholly or partially shaped in a top-cut conical form.

In the present invention, the effect of uniformizing the plasma density can be further enhanced where the wall of the plasma formation chamber is made of a dielectric material and the structure thereof is such that microwaves can be introduced into the plasma formation chamber uniformly throughout the inside of the plasma formation chamber.

BRIEF DESCRIPTION OF THE DRAWINGS

The foregoing and other objects and advantages of the present invention will be better understood by reference to the following description, taken in connection with the accompanying drawings, in which.

DETAILED DESCRIPTION OF PREFERRED EMBODIMENTS

A description will now be made of examples of the microwave plasma treatment apparatus of the present invention while referring to the accompanying drawings.

Figure 1:
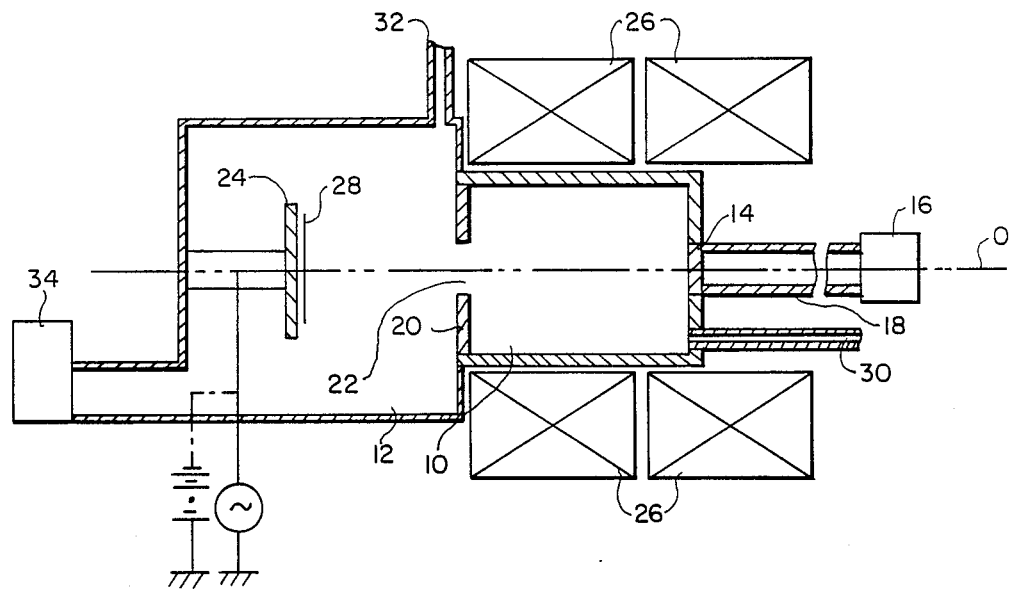
FIG. 1 is a schematic partial front cross-sectional view of a conventional microwave plasma treatment apparatus.

Additionally stated, the figures are drawn so schematically as to merely enable the understanding of the present invention. Accordingly, the constituent parts of every microwave plasma treatment apparatus are drawn schematically as to shapes and sizes thereof as well as the positional relationships therebetween. The same numerals as in FIG. 1 denote constitutional parts corresponding to those of the conventional apparatus already described by reference of FIG. 1 unless otherwise identified, while a detailed description of such constitutional parts is omitted.

The following examples are mere preferable examples of the apparatus of the present invention. Accordingly, it should be understood that the scope of the present invention is not limited only to numerical values, shapes and positional relationships as mentioned hereinbelow.

Figure 4:
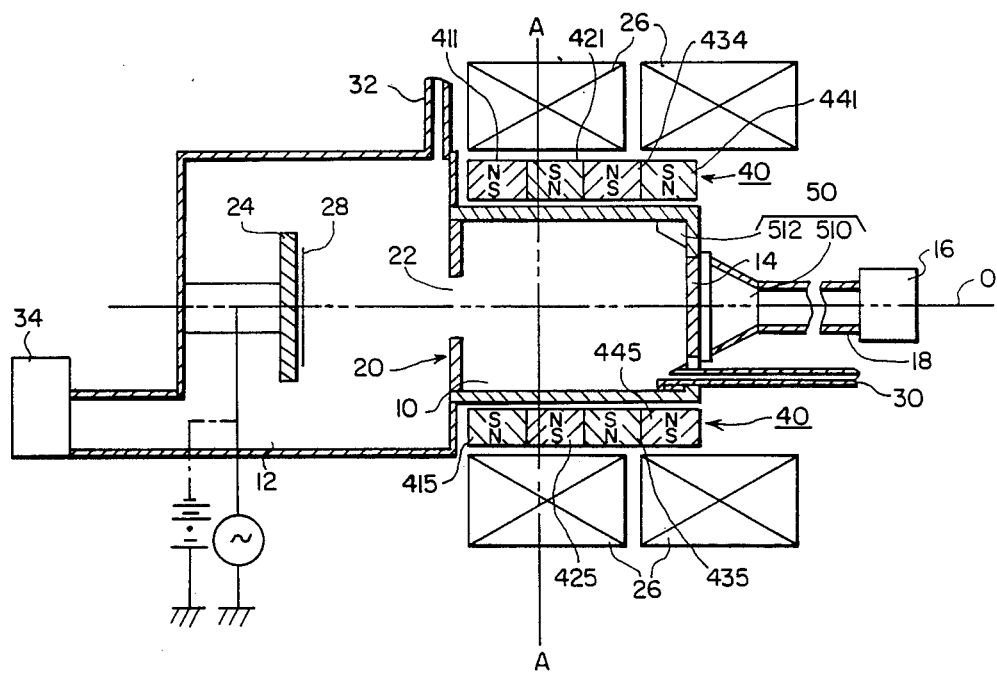
FIG. 4 is a schematic partial front cross-sectional view of the first example of the microwave plasma treatment apparatus according to the present invention.
Figure 5:
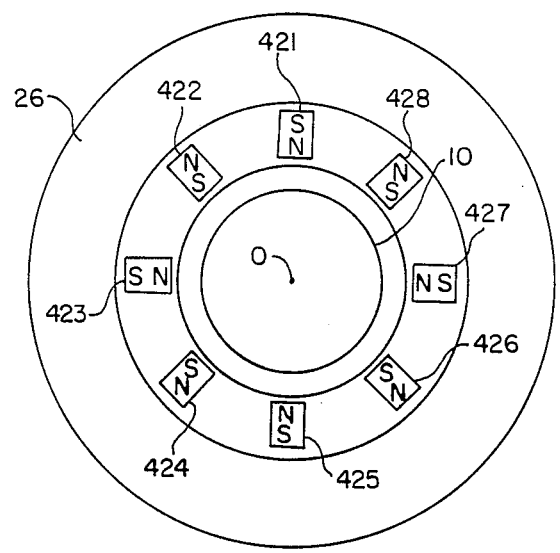
FIG. 5 is a cross-sectional view taken along the line A—A of FIG. 4, which is illustrative of the positional relationship between a plasma formation chamber, auxiliary magnets and a magnetic circuit viewed in the direction of the central axis of the plasma formation chamber.

FIG. 4 is a schematic partial front cross-sectional view of the structure of the first example of the microwave plasma treatment apparatus according to the present invention, while FIG. 5 is a cross-sectional view taken along the line A—A of FIG. 4, which is illustrative of the positional relationship between a plasma formation chamber, auxiliary magnets and a magnetic circuit viewed in the direction of the central axis of the plasma formation chamber.

As already described, an object (substrate) treatment chamber 12 wherein a substrate 28 as an object is to be treated is provided adjacent to a plasma formation chamber 10 wherein a plasma is to be formed through electron cyclotron resonance. A coreless solenoid coil(s) 26 is provided as a magnetic circuit(s) around the outer periphery of the plasma formation chamber 10.

In the apparatus according to the present invention, an even-numbered plurality of auxiliary magnets which number at least two are provided around the other periphery of the plasma formation chamber 10 and on the inner side of the solenoid coil(s) 26. These auxiliary magnets are arranged symmetrically with respect to central axis O of the plasma formation chamber 10 along the circumference of the plasma formation chamber 10 in such a way that every auxiliary magnet is reverse in the direction of polarity to an auxiliary magnet(s) adjacent thereto, that is, the magnetic poles S and N of every auxiliary magnet are disposed in such a way as to adjoin the magnetic poles N and S, respectively, of the auxiliary magnet(s) adjacent thereto. The auxiliary magnets may be arranged either in one group or in two or more groups each consisting of a plurality of magnets which groups are arranged in the direction of the central axis O. These auxiliary magnets can form a strong magnetic field locally in the neighborhood of the inner wall surface of the plasma formation chamber 10 to heighten the plasma density locally in the above-mentioned neighborhood.

In this example, a plurality of groups 40 of auxiliary magnets are disposed in such a way as shown in FIGS. 4 and 5. By way of example, the group 40 of the auxiliary magnets are arranged in such a way that the first group of auxiliary magnets 411, 412, 413, ..., 417 and 418 disposed along the circumference of the plasma formation chamber 10, the second group of auxiliary magnets 421, ... 428 disposed in the same manner as described above, the third group of auxiliary magnets 431, ... 438 disposed in the same manner as described above, and fourth group of auxiliary magnets 441, ... 448 disposed in the same manner as described above are juxtaposed in this order from the side of the object treatment chamber 12 in the axial direction of the plasma formation chamber 10. Thus, the total number of auxiliary magnets is 32. As shown in FIGS. 4 and 5, the magnetic poles S and N of every auxiliary magnet are respectively reverse in polarity to the adjoining magnetic poles of auxiliary magnets located adjacent thereto either in the circumferential direction of the plasma formation chamber 10 or in the axial direction of the plasma formation chamber 10.

Figure 6:
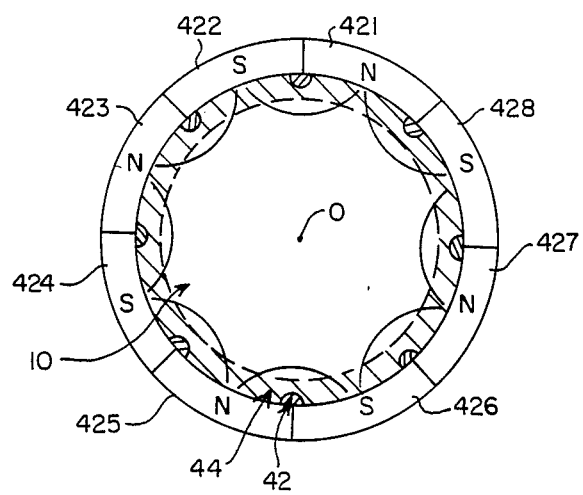
FIG. 6 is a diagram showing the distribution, in plasma formation chamber, of magnetic field formed by a group of auxiliary magnets.

FIG. 6 shows the state of magnetic field formed in the neighborhood of the inner wall surface of the plasma formation chamber 10 when the aforementioned groups 40 of auxiliary magnets (each group consisting of 8 auxiliary magnets) are arranged around the outer periphery of the plasma formation chamber 10. FIG. 6 is a diagram showing the magnetic field distribution in an imaginary plane normal to the central axis O. In FIG. 6, the broken line refers to the borderline of a region extending from the inner wall surface of the plasma formation chamber 10 to a distance of about 3 cm therefrom toward the central axis O. The above-mentioned region is considered the neighborhood of the inner wall surface of the plasma formation chamber 10. In FIG. 6, the solid line each with an arrow refer to magnetic fluxes created in the neighborhood of the inner wall surface of the plasma formation chamber 10 by means of, for example, the auxiliary magnets 421 to 428. The aforementioned groups 40 of the auxiliary magnets can locally form strong magnetic fields 42 in a microscopic aspect, while at the same time forming a magnetic field 44 stronger by at least 300 to 400 G than that of the central region of the inside of the plasma formation chamber 10 in a microscopic aspect. Additionally stated, the magnetic fluxes created inside the plasma formation chamber 10 by means of the groups 40 of the auxiliary magnets are not affected by the material of the wall of the plasma formation chamber 10.

In contrast, if no groups 40 of auxiliary magnets are provided, the power of microwaves is not so much increased in the neighborhood of the inner wall surface of the plasma formation chamber 10, though increased in the wall surface of the central axis O thereof, as the power of microwaves introduced into the plasma formation chamber 10 is increased. This results in a relatively low plasma density in the neighborhood of the inner wall surfaces of the plasma formation chamber 10 as compared with that in the neighborhood of the central axis O. When the aforementioned groups 40 of the auxiliary magnets are provided, the magnetic field formed in the neighborhood of the inner wall surface of the plasma formation chamber 10 is enhanced to set a plasma in a cycloidal movement in a multi-cusp magnetic field (local) formed by the groups 40 of the auxiliary magnets to thereby heighten the plasma density in the neighborhood of the inner wall surface of the plasma formation chamber 10. Therefore, the plasma density as a whole is substantially uniformized between the neighborhood of the central axis O and the neighborhood of the inner wall surface of the plasma formation chamber 10. Thus, a substantially uniform high-density plasma can be secured in the plasma formation chamber 10 to enable the ionic current density distribution to be uniformized in the object treatment chamber 12.

As already described, the plasma formation chamber 10 is provided not only with a gas introducing system 30 for introducing thereinto a plasma-forming gas, but also with a microwave introducing window 14 made of a dielectric material such as quartz glass or a ceramic material. Like the conventional technique, microwaves sent through the wave guide pipe 18 from a microwave power source 16 are introduced into the plasma formation chamber 10 via the microwave introducing window 14.

In the apparatus of the present invention, however, such introduction of microwave is preferably done by means of a microwave introducing means 50. The microwave introducing means 50 comprises the above-mentioned microwave introducing window 14, a horn-like portion 510 provided between a wave guide pipe 18 and the microwave introducing window 14, and a block 512 provided adjacent to the microwave introducing window 14 on the inside of the plasma formation chamber 10 and having such inner wall surfaces as to provide the inner diameter of the block 512 increasing along the central axis O from the microwave introducing window 14 toward the plasma extracting means 20 [hereinafter referred to as a "top-cut conical inner wall surface" (horn-like inner wall surface)].

A description will now be made of the operation of the apparatus having the structure as shown in FIGS. 4 and 5.

First, a vacuum pumping system 34 is set in motion to evacuate the object treatment chamber 12 to a predetermined degree of vacuum. Thereafter, a given gas is introduced into the plasma formation chamber 10 through the gas introducing system 30 to secure and maintain a predetermined gas pressure under which a treatment is to be effected. Subsequently, microwaves of 2.45 GHz are introduced into the plasma formation chamber 10 through the wave guide pipe 18 and the microwave introducing means 50 (510, 14, 512).

An electric current is flowed through the solenoid coil(s) 26 as the magnetic circuit(s) to form a magnetic field of 875 G in the plasma formation chamber 10. This magnetic field cooperates with an electric field formed by the microwaves to induce electron cyclotron resonance in the plasma formation chamber 10 to thereby produce an energy with which the gas introduced into the plasma formation chamber 10 is turned into a high-density plasma.

Here, as already described, if no auxiliary magnets are provided, the high-density plasma is concentrated in the neighborhood of the central axis O as the microwave power is increased, with the result that the plasma density is lowered in the neighborhood of the inner wall surface of the plasma formation chamber 10.

In contrast, since the apparatus of the present invention is provided with, for example, the groups 40 of the auxiliary magnets numbering 32 which are arranged around the periphery of the plasma formation chamber 10 in such a way that the two magnetic poles of every auxiliary magnet are respectively reverse in polarity to the adjoining magnetic poles of auxiliary magnets disposed adjacent thereto either in the circumferential direction of the plasma formation chamber 10 or in the axial direction thereof as shown in FIGS. 4 and 5, these auxiliary magnets locally form a strong magnetic field in the neighborhood of the inner wall surface of the plasma formation chamber 10, wherein a high-density plasma is, therefore, formed. Further, since the block 512 with the top-cut conical inner wall surface, provided in the plasma formation chamber 10, can serve to continuously propagate microwaves into the plasma formation chamber 10, the microwaves are efficiently introduced uniformly into the plasma formation chamber 10 without any loss thereof. As a result, the introduced gas is turned into a high-density plasma substantially uniform throughout the inside of the plasma formation chamber 10.

Figure 2:
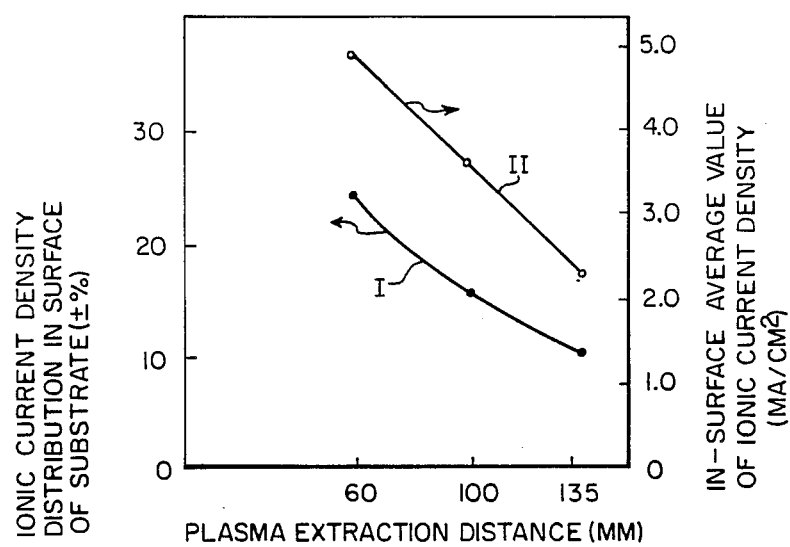
FIG. 2 is a diagram showing the curve of relationship between the plasma extraction distance and the ionic current density distribution in the surface of a substrate and the curve of relationship between the plasma extraction distance and the in-surface average value of ionic current density, which were obtained using the conventional microwave plasma treatment apparatus.
Figure 7:
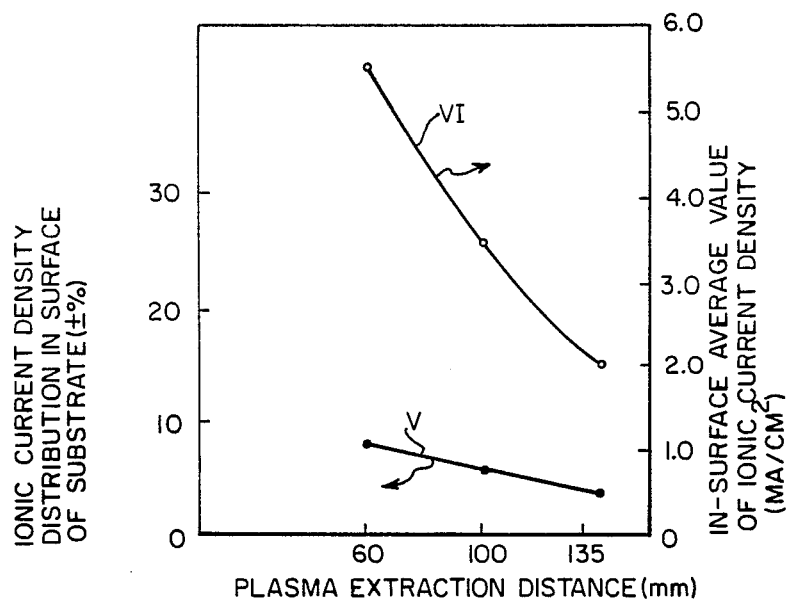
FIG. 7 is a diagram showing the curve of relationship between the plasma extraction distance and the ionic current density distribution in the surface of a substrate and the curve of relationship between the plasma extraction distance and the in-surface average value of ionic current density, which were obtained using the microwave plasma treatment apparatus according to the present invention.

FIG. 7 is a diagram, similar to FIG. 2, which shows the relationship between the uniformity of the ionic current density distribution in the surface of a substrate and the plasma extraction distance (Curve V) and the relationship between the in-surface average value of ionic current density and the plasma extraction distance (Curve VI) when this example of the apparatus according to the present invention was operated under a gas pressure of $5 \times 10^{-4}$ Torr with application of a microwave power of 600 W while introducing $N_2$ gas (20 sccm) into the plasma formation chamber 10 through the gas introducing system 30. It will be understood from the experimental data shown in FIG. 7 that the uniformity of the ionic current density distribution in the surface of the substrate was greatly improved over that of the ionic current density distribution shown in FIG. 2 and obtained using the conventional apparatus even when the plasma extraction distance was short.

Figure 3:
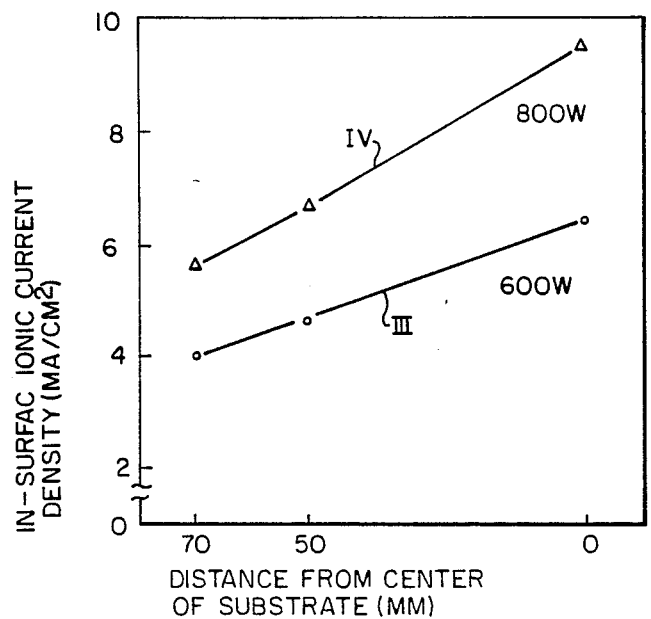
FIG. 3 is a diagram showing the curve of relationship between the distance from the center of a substrate and the in-surface ionic current density, which was obtained using the conventional microwave plasma treatment apparatus.
Figure 8:
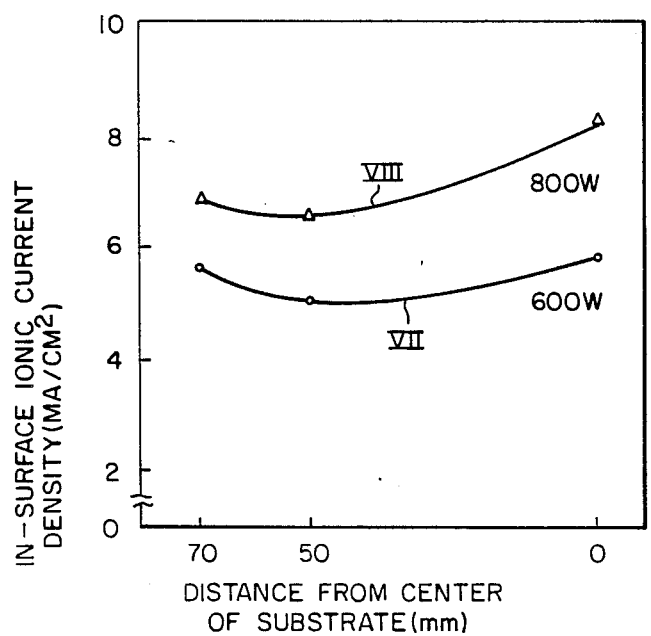
FIG. 8 is a diagram showing the curve of relationship between the distance from the center of a substrate and the in-surface ionic current density, which was obtained using the microwave plasma treatment apparatus according to the present invention.

FIG. 8 is a diagram, similar to FIG. 3, which shows the relationship between the ionic current density in the surface of a substrate and the distance from the center of the substrate when the microwave power was set to be 600 W (Curve VII) or 800 W (Curve VIII).

When the experimental data shown in FIG. 8 are compared with those shown in FIG. 3, it will be understood that the groups 40 of the auxiliary magnets arranged around the periphery of the plasma formation chamber 10 formed a strong magnetic field in the neighborhood of the inner wall surface of the plasma formation chamber 10 to heighten in the above-mentioned neighborhood the plasma density, which would have been low if no auxiliary magnets had been provided, to an extent comparable to that in the neighborhood of the central axis O, in view of the fact that the ionic current density in the case of the aforementioned apparatus according to the present invention was higher than that in the case of the conventional apparatus.

In view of the above, the plasma extraction distance between the plasma extracting means or panel 20 and the substrate 28 can be decreased enough to shorten the length of the apparatus in the axial direction thereof, for example, by 20 cm or more in comparison with the length of the conventional apparatus, while the speed of the treatment of the substrate 28 as the object to be treated can be uniformized all across the surface of the substrate 28 and the treatment can be speeded up with a higher density of ionic current.

Further, the apparatus according to the present invention makes it possible to uniformize the ionic current density distribution all across the surface of a substrate having a diameter as large as about 200 mm. This enables the treatment of a substrate having a larger diameter than those of substrates capable of being treated with the conventional apparatus. Furthermore, although it has heretofore been anticipated that a microwave power source of at least 2 KW is necessary in order to secure an ionic current density substantially uniform all across the surface of a substrate having such a large area, a microwave power source of at least 1 KW is satisfactory in the apparatus of the present invention. Thus, the microwave power source can also be miniaturized according to the present invention.

The aforementioned auxiliary magnets in the groups 40 may be constituted of permanent magnets.

Further, the auxiliary magnets in the groups 40 may be varied in size, attachment position and number in accordance with etching or film formation conditions.

Figure 9:
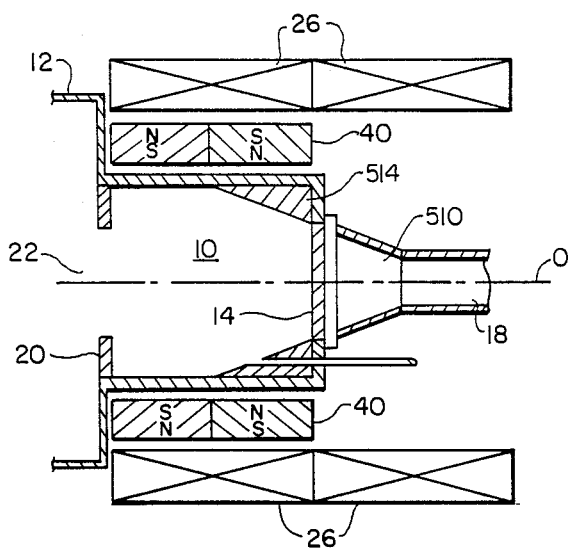
FIG. 9 is a schematic partial front cross-sectional view of the second example of the microwave plasma treatment apparatus according to the present invention, which is illustrative mainly of a plasma formation chamber and the neighborhood thereof.

FIG. 9 is a schematic cross-sectional view of the plasma formation chamber of the second example of the apparatus according to the present invention. In this second example, a plurality of auxiliary magnets are provided in two groups 40 in the direction of the central axis O of the plasma formation chamber 10, and a block 514 with a top-cut conical inner wall surface as one constituent part of a microwave introducing means 50 which is provided inside the plasma formation chamber 10 is mainly different in shape from that in the first example. The other constituent parts of the apparatus are substantially the same as in the first example.

Figure 10A:
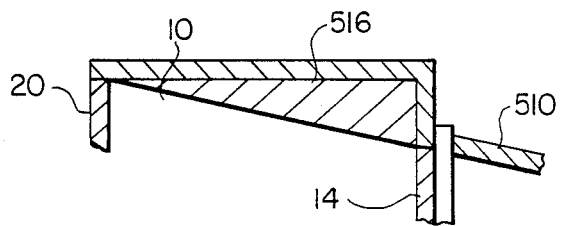
FIGS. 10(a), 10(b) and 10(c) are schematic partial cross-sectional views of blocks each provided with an inner wall surface shaped in a top-cut conical form.
Figure 10B:
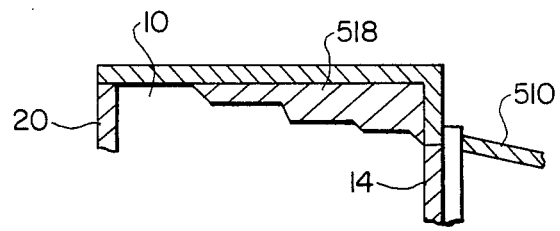
Figure 10C:
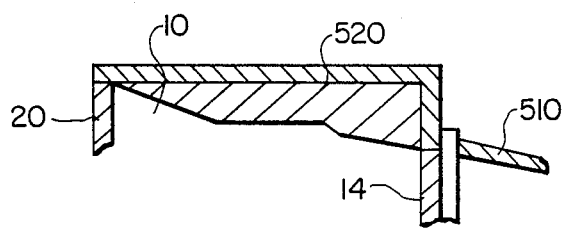

FIGS. 10(a) 10(b) and 10(c) are schematic partial cross-sectional views of blocks 516, 518 and 520 each with a top-cut conical inner wall surface as examples of the one constituent part of the microwave introducing means 50. All the blocks 514, 516, 518 and 520, though mutually different in shape, have an inner wall surface symmetrical with respect to the central axis of the plasma formation chamber 10 which surface provides the inner diameter of block increasing from a microwave introducing window 14 toward a plasma extracting means 20. In the example of FIG. 9, the above-mentioned inner diameter is continuously increased from the microwave introducing window 14 to the substantial middle of the plasma formation chamber 10 to which middle the block 514 extends from the microwave introducing window 14. In the example of FIG. 10(a), the block 516 extends to the end of the inner wall surface of the plasma formation chamber 10. In the examples of FIGS. 10(b) and 10(c), the above-mentioned inner diameter is step-wise varied. The selection of the shape of any one of these blocks enables the uniformity and speed of the treatment to be each enhanced by at least 3% as compared with the case where no block is provided.

Figure 11:
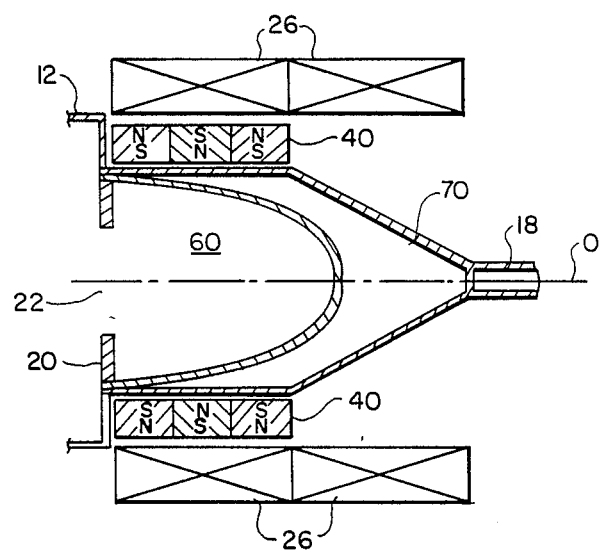
FIG. 11 is a schematic partial front cross-sectional view of the third example of the microwave plasma treatment apparatus according to the present invention, which is illustrative mainly of a plasma formation chamber and the neighborhood thereof.

FIG. 11 is a schematic partial cross-sectional view of the structure of the third example of the apparatus according to the present invention, which is mainly illustrative of a plasma formation chamber and a microwave introducing means. In this example, the plasma formation chamber 60 provided with a top-cut conical inner wall made of a dielectric material such as $SiO_2$ or $Al_2O_3$ is shaped in the form of a cup opened on the side of a plasma extracting means 20, while a microwave introducing means 70 is shaped in the form of a horn opened on the side of the plasma extracting means 20 and disposed in such a way as to cover the plasma formation chamber 60 from the outside thereof. The structure of this example is substantially similar to that of the example shown in FIG. 4 except that the plasma formation chamber 60 is partially disposed inside the tapered portion of the microwave introducing means 70 adjoining the end of a wave guide pipe 18.

Substantially the same effects as in the case where one of the aforementioned blocks is provided can be obtained in the case of the structure of FIG. 11 as well.

While all of the foregoing examples have been described with reference to the respective apparatuses wherein a divergent magnetic field formed by means of the magnetic circuit(s) 26 is utilized to extract a plasma, use may be made of an acceleration type apparatus wherein the plasma extracting aperture 22 of a plasma extracting means 20 is provided with a grid (grid electrode) (not shown in FIG. 4) which is utilized to extract a plasma. Either a DC voltage or an AC voltage may be applied to such a grid.

In the structures of the foregoing examples, another gas introducing system 32 through which a reactive gas is introduced into the object treatment chamber 12 may further be provided. In this case, a film deposition or formation apparatus is provided.

Where the treatment is either etching or film formation, either a DC voltage or an AC voltage may be applied to the object table 24.

While the auxiliary magnets, the plasma formation chamber, the magnet circuit(s), etc. are disposed with gaps therebetween in the structures of FIGS. 4, 5, 9, and 11, they may be disposed in suitable contact with each other, and the auxiliary magnets in particular are preferably disposed as close to the plasma formation chamber as possible.

As described hereinbefore, according to the apparatus of the present invention wherein auxiliary magnets are disposed around the periphery of a plasma formation chamber, the plasma density can be uniformized to make it possible to sufficiently uniformly treat the surface of a substrate at a high speed even when the diameter of the substrate is large or even when the microwave power is increased, while the size of the apparatus can be reduced.

Further, the uniform treatment of a substrate can be more efficiently effected when the plasma formation chamber is provided with a top-cut conical inner wall surface and/or when the structure of the apparatus is such that microwaves can be introduced into the plasma formation chamber through the substantially whole wall thereof.

What is claimed is:

1. A microwave plasma treatment apparatus comprising:
   a cylindrical plasma formation chamber,
   an object treatment chamber adjoining said plasma formation chamber in the direction of the central axis thereof,
   a magnetic circuit(s) provided around the periphery of said plasma formation chamber,
   a plasma extracting means provided on the border between said plasma formation chamber and said object treatment chamber,
   an even-numbered plurality of auxiliary magnets numbering at least two and provided around the periphery of said plasma formation chamber and on the inner side of said magnetic circuit(s), and
   a microwave introducing means provided along the central axis of said plasma formation chamber and on the opposite side thereof to said object treatment chamber;
   wherein the plasma formation chamber is provided with a plasma-forming gas introducing port,
   wherein said object treatment chamber is provided with an object table for placing thereon an object to be treated,
   wherein said auxiliary magnets are arranged symmetrically with respect to the central axis of said plasma formation chamber in such a way that the magnetic poles of every auxiliary magnet are respectively reversed in polarity relative to the adjoining magnetic poles of an auxiliary magnet adjacent thereto, and
   wherein the electron cyclotron resonance phenomenon induced by an electric field formed by microwaves introduced into said plasma formation chamber through said microwave introducing means and a magnetic field formed by means of said magnetic circuit(s) and said auxiliary magnets is utilized to turn a plasma-forming gas introduced into said plasma formation chamber into a plasma, which is then extracted into said object treatment chamber through said plasma extracting means to irradiate therewith said object placed on said object table.

2. A microwave plasma treatment apparatus as claimed in claim 1, wherein said auxiliary magnets are arranged in one group or two or more groups in the direction of the central axis of said plasma formation chamber in such a way that the magnetic poles of every auxiliary magnet in one group are respectively reversed in polarity relative to the adjoining magnetic poles of an auxiliary magnet disposed adjacent thereto in the adjoining group.

3. A microwave plasma treatment apparatus as claimed in claim 1, wherein the inner wall of said plasma formation chamber or at least a plasma introducing window which serves as part of the inner wall of said plasma formation chamber is made of a dielectric material, and wherein said microwave is introduced into said plasma formation chamber through said inner wall or said plasma introducing window.

4. A microwave plasma treatment apparatus as claimed in claim 1, wherein said microwave introducing means is provided with an inner wall surface extending from the outside of said plasma formation chamber to the inside of said plasma formation chamber, disposed symmetrically with respect to the central axis of said plasma formation chamber, and providing the inner diameter increasing along said central axis toward said extracting means.

5. A microwave plasma treatment apparatus as claimed in claim 4, wherein the portion of said microwave introducing means located on the outside of said plasma formation chamber comprises a wave guide pipe, while the portion of said microwave introducing means located on the inside of said plasma formation chamber is constituted of a block made of a dielectric material.

6. A microwave plasma treatment apparatus as claimed in claim 1, wherein said plasma formation chamber is shaped in the form of a cup opened on the side of said plasma extracting means, while said microwave introducing means is shaped in the form of a horn opened on the side of said plasma extracting means and put on said plasma formation chamber to cover the said plasma formation chamber.

7. A microwave plasma treatment apparatus as claimed in claim 1, wherein said auxiliary magnets are each constituted of a permanent magnet.

* * * * *

UNITED STATES PATENT AND TRADEMARK OFFICE
CERTIFICATE OF CORRECTION

PATENT NO. : 4,960,073
DATED : October 2, 1990
INVENTOR(S) : Yasuhiro Suzuki, et al.

It is certified that error appears in the above-identified patent and that said Letters Patent is hereby corrected as shown below:

The material appearing at Column 2, line 31, beginning with "the surface thereof to be treated" through Column 2, line 62, ending with "magnetic field formed with the" should be deleted from Column 2 and inserted at Column 1, line 66, after "such a way that".

Signed and Sealed this

Twenty-first Day of April, 1992

Attest:

HARRY F. MANBECK, JR.

*Attesting Officer*     *Commissioner of Patents and Trademarks*